(12) United States Patent
Lin

(10) Patent No.: US 8,503,136 B2
(45) Date of Patent: Aug. 6, 2013

(54) PROTECTING CIRCUIT AND CONTROL CIRCUIT FOR REDUCING LEAKAGE CURRENT

(75) Inventor: Che-Min Lin, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 149 days.

(21) Appl. No.: 13/280,014

(22) Filed: Oct. 24, 2011

(65) Prior Publication Data

US 2013/0100557 A1 Apr. 25, 2013

(51) Int. Cl.
*H02H 7/00* (2006.01)

(52) U.S. Cl.
USPC .............................................................. 361/1

(58) Field of Classification Search
USPC .............................................................. 361/1
See application file for complete search history.

(56) References Cited

U.S. PATENT DOCUMENTS

| | | | |
|---|---|---|---|
| 6,147,540 A * | 11/2000 | Coddington | 327/333 |
| 6,487,139 B1 * | 11/2002 | Pathak | 365/230.06 |
| 6,642,769 B1 * | 11/2003 | Chang et al. | 327/333 |
| 7,447,105 B2 | 11/2008 | Lee | |
| 7,567,112 B2 * | 7/2009 | Shen | 327/333 |
| 2003/0001628 A1 * | 1/2003 | Hsu et al. | 327/103 |
| 2005/0270079 A1 * | 12/2005 | Chen et al. | 327/333 |
| 2009/0108904 A1 * | 4/2009 | Shiffer, II | 327/333 |

* cited by examiner

*Primary Examiner* — Scott Bauer
(74) *Attorney, Agent, or Firm* — Muncy, Geissler, Olds & Lowe, PLLC

(57) ABSTRACT

A protecting circuit for reducing leakage currents comprises a first PMOS transistor (P-channel Metal-Oxide-Semiconductor Field-Effect Transistor), a second PMOS transistor, a first NMOS transistor (N-channel Metal-Oxide-Semiconductor Field-Effect Transistor), and a second NMOS transistor. The first PMOS transistor is coupled between a first voltage node and a node, and comprises a first gate coupled an input node. The second PMOS transistor is coupled between the node and an output node. The first NMOS transistor is coupled between the output node and a ground node, and comprises a third gate coupled to the input node. The second NMOS transistor is coupled between the input node and a second gate of the second PMOS transistor, and comprises a fourth gate coupled to a second voltage node.

18 Claims, 3 Drawing Sheets

PROTECTING CIRCUIT AND CONTROL CIRCUIT FOR REDUCING LEAKAGE CURRENT

BACKGROUND OF THE INVENTION

1. Field of the Invention

The disclosure generally relates to a protecting circuit, and more particularly, relates to a protecting circuit for reducing leakage currents

2. Description of the Related Art

Gate induced drain leakage (GIDL) is a serious problem for complementary metal-oxide-semiconductors (CMOS). GIDL is a current in an off-state. If the voltage difference between a gate and a drain of a transistor becomes higher, GIDL will become more serious. That is, the complementary metal-oxide-semiconductor will consume more electrical power in vain.

BRIEF SUMMARY OF THE INVENTION

For solving the GIDL problem, the invention provides a protecting circuit and a control circuit that can reduce the voltage difference between a gate and a drain so as to reduce GIDL.

In one exemplary embodiment, the disclosure is directed to a protecting circuit for reducing leakage currents, comprising: a first PMOS transistor (P-channel Metal-Oxide-Semiconductor Field-Effect Transistor), coupled between a first voltage node and a node, and having a first gate coupled to an input node; a second PMOS transistor, coupled between the node and an output node, and having a second gate; a first NMOS transistor (N-channel Metal-Oxide-Semiconductor Field-Effect Transistor), coupled between the output node and a ground node, and having a third gate coupled to the input node; and a second NMOS transistor, coupled between the input node and the second gate, and having a fourth gate coupled to a second voltage node, wherein the ground node provides a ground voltage, the first voltage node provides a first voltage, the second voltage node provides a second voltage, and the first and second voltages are both higher than the ground voltage.

In another exemplary embodiment, the disclosure is directed to a protecting circuit for reducing leakage currents, comprising: a first PMOS transistor (P-channel Metal-Oxide-Semiconductor Field-Effect Transistor), coupled between a first voltage node and a node, and having a first gate coupled to an input node; a second PMOS transistor, coupled between the node and an output node, and having a second gate; a first NMOS transistor (N-channel Metal-Oxide-Semiconductor Field-Effect Transistor), coupled between the output node and a ground node, and having a third gate coupled to the input node; a first inverter, coupled to a second voltage node; and a second inverter, coupled to the second voltage node, wherein the input node is coupled to the second gate through the first and second inverters, the ground node provides a ground voltage, the first voltage node provides a first voltage, the second voltage node provides a second voltage, and the first and second voltages are both higher than the ground voltage.

In one exemplary embodiment, the disclosure is directed to a control circuit for reducing leakage currents, comprising: a first PMOS transistor (P-channel Metal-Oxide-Semiconductor Field-Effect Transistor), coupled between a first voltage node and a first node, and having a first gate coupled to a second node; a second PMOS transistor, coupled between the first node and a third node, and having a second gate; a first NMOS transistor (N-channel Metal-Oxide-Semiconductor Field-Effect Transistor), coupled between the third node and a ground node, and having a third gate coupled to the second node; a second NMOS transistor, coupled between the second node and the second gate, and having a fourth gate coupled to a second voltage node; an inverter, coupled to the first voltage node, wherein an input node is couple to the second node through the inverter; and a power gate driving circuit, coupled to the second voltage node and to the third node, and generating a first output signal and a second output signal according to an input signal which is received through the input node, wherein the ground node provides a ground voltage, the first voltage node provides a first voltage, the second voltage node provides a second voltage, and the first and second voltages are both higher than the ground voltage.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
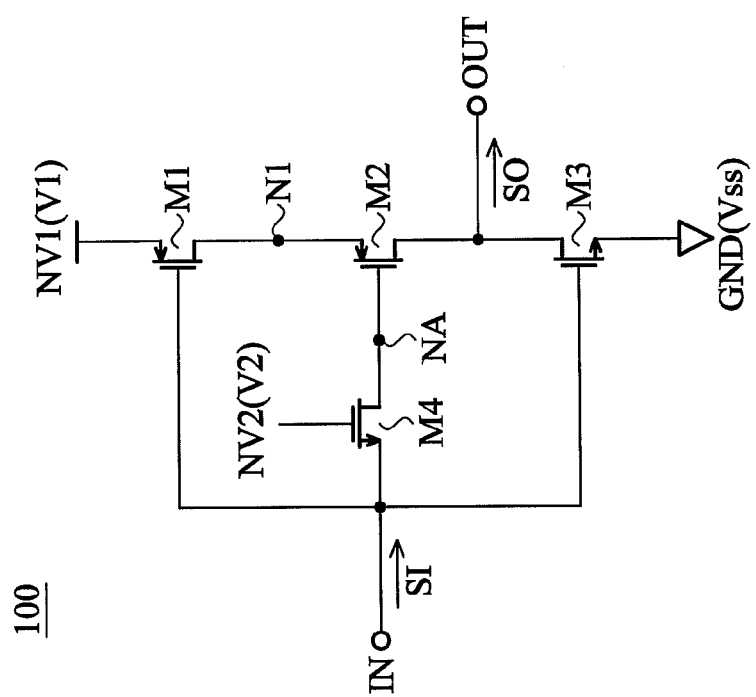
FIG. 1 is a diagram for illustrating a protecting circuit according to an embodiment of the invention.

FIG. 1 is a diagram for illustrating a protecting circuit 100 according to an embodiment of the invention. As shown in FIG. 1, the protecting circuit 100 comprises PMOS transistors (P-channel Metal-Oxide-Semiconductor Field-Effect Transistor) M1, M2, and NMOS transistors (N-channel Metal-Oxide-Semiconductor Field-Effect Transistor) M3, M4. A ground node GND is configured to provide a ground voltage Vss. A first voltage node NV1 is configured to provide a first voltage V1, and a second voltage node NV2 is configured to provide a second voltage V2, wherein each of the first and second voltages V1, V2 is higher than the ground voltage Vss.

Figure 2:
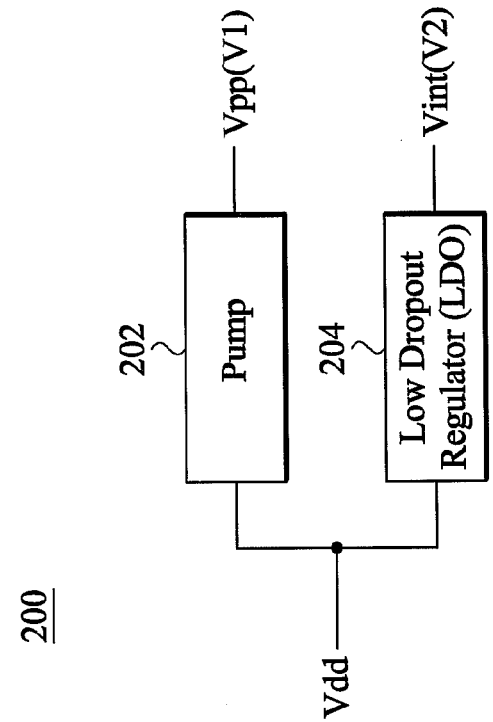
FIG. 2 is a diagram for illustrating a conversion circuit according to an embodiment of the invention.

FIG. 2 is a diagram for illustrating a conversion circuit 200 according to an embodiment of the invention. As shown in FIG. 2, an external voltage Vdd (i.e., work voltage Vdd) of the protecting circuit is converted into a pump voltage Vpp through a pump 202 (i.e., a step-up circuit), and the external voltage Vdd is converted into an internal voltage Vint through a LDO (Low Dropout Regulator) 204 (i.e., a step-down circuit). In a preferred embodiment, the first voltage V1 is equivalent to the pump voltage Vpp, and the second voltage V2 is equivalent to the internal voltage Vint. The first voltage V1 is usually higher than the second voltage V2. In some embodiments, the ground voltage Vss is equal to 0V, the external voltage Vdd is equal to 1.8V, the first voltage V1 is equal to 3V, and the second voltage V2 is equal to 1.1V or 1.0V.

Referring to FIG. 1, the protecting circuit 100 has an input node IN and an output node OUT, wherein the input node IN is configured to receive an input signal SI, and the output node OUT is configured to output an output signal SO. The PMOS transistor M1 has a gate, a source and a drain, wherein the gate is electrically connected to the input node IN, the source is electrically connected to the first voltage node NV1, and the drain is electrically connected to a node N1. The PMOS transistor M2 has a gate, a source and a drain, wherein the source is electrically connected to the node N1, and the drain is electrically connected to the output node OUT. The NMOS transistor M3 has a gate, a source and a drain, wherein the gate is electrically connected to the input node IN, the source is electrically connected to the ground node GND, and the drain is electrically connected to the output node OUT. The NMOS transistor M4 has a gate, a source and a drain, wherein the gate is electrically connected to the second voltage node NV2, the source is electrically connected to the input node IN, and the drain is electrically connected to the gate of the PMOS transistor M2. It is noted that since the input signal SI may be a high voltage or a low voltage, the drain and the source of the NMOS transistor M4 may be interchanged with each other, not as shown in FIG. 1. In another embodiment, the first voltage node NV1 or the second voltage node NV2 may provide the external voltage Vdd instead of the first voltage V1 or the second voltage V2.

The protecting circuit 100 of the invention can reduce the voltage difference between a gate and a drain so as to reduce GIDL. For example, referring to the protecting circuit 100, the ground voltage Vss is equal to 0V, the external voltage Vdd is equal to 1.8V, the first voltage V1 is equal to 3V, the second voltage V2 is equal to 1.1V, and a threshold voltage of each of the NMOS and PMOS transistors is equal to 0.5V. Under this circumstance, if the input signal SI is equal to the first voltage V1, a voltage of a node NA is equal to 0.6V (i.e., 1.1V−0.5V=0.6V), and a voltage of a node N1 is equal to 1.1V (i.e., 1.1V−0.5V+0.5V=1.1V). With the PMOS transistor M2 and the NMOS transistor M4, the voltage difference between the gate and the drain of the PMOS transistor M1 is reduced from 3V (without M2, M4, the voltage difference between the gate and the drain of M1 is 3V, i.e., 3V−0V=3V) to 1.9V (i.e., 3V−1.1V=1.9V) so as to reduce GIDL.

Figure 3:
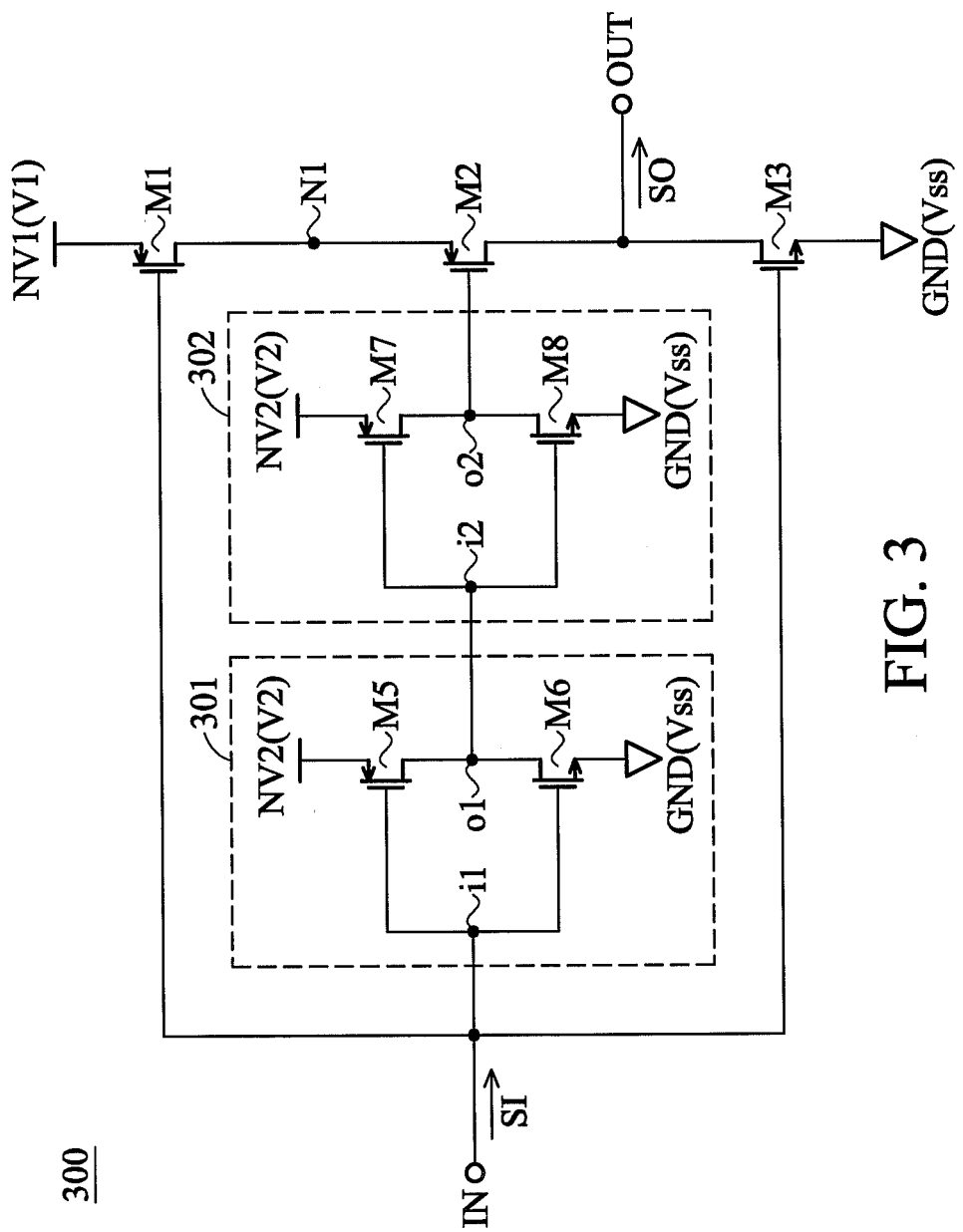
FIG. 3 is a diagram for illustrating a protecting circuit according to another embodiment of the invention.

FIG. 3 is a diagram for illustrating a protecting circuit 300 according to another embodiment of the invention. The protecting circuit 300 as shown in FIG. 3 has functions and structure that are similar to those of the protecting circuit 100 as shown in FIG. 1. The main difference is that the NMOS transistor M4 is replaced with inverters 301, 302 coupled to the second voltage node NV2, wherein the input node IN is coupled to the gate of the PMOS transistor M2 through the inverters 301, 302. The inverter 301 comprises a PMOS transistor M5 and an NMOS transistor M6. The PMOS transistor M5 has a gate, a source and a drain, wherein the gate is electrically connected to an inverter input end i1, the source is electrically connected to the second voltage node NV2, and the drain is electrically connected to an inverter output end o1. The NMOS transistor M6 has a gate, a source and a drain, wherein the gate is electrically connected to the inverter input end i1, the source is electrically connected to the ground node GND, and the drain is electrically connected to the inverter output end o1. The inverter input end i1 of the inverter 301 is electrically connected to the input node IN, and the inverter output end of the inverter 301 is electrically connected to an inverter input end i2 of the inverter 302. The inverter 302 comprises a PMOS transistor M7 and an NMOS transistor M8. The PMOS transistor M7 has a gate, a source and a drain, wherein the gate is electrically connected to the inverter input end i2, the source is electrically connected to the second voltage node NV2, and the drain is electrically connected to an inverter output end o2. The NMOS transistor M8 has a gate, a source and a drain, wherein the gate is electrically connected to the inverter input end i2, the source is electrically connected to the ground node GND, and the drain is electrically connected to the inverter output end o2. The inverter output end o2 of the inverter 302 is electrically connected to the gate of the PMOS transistor M2.

Figure 4:
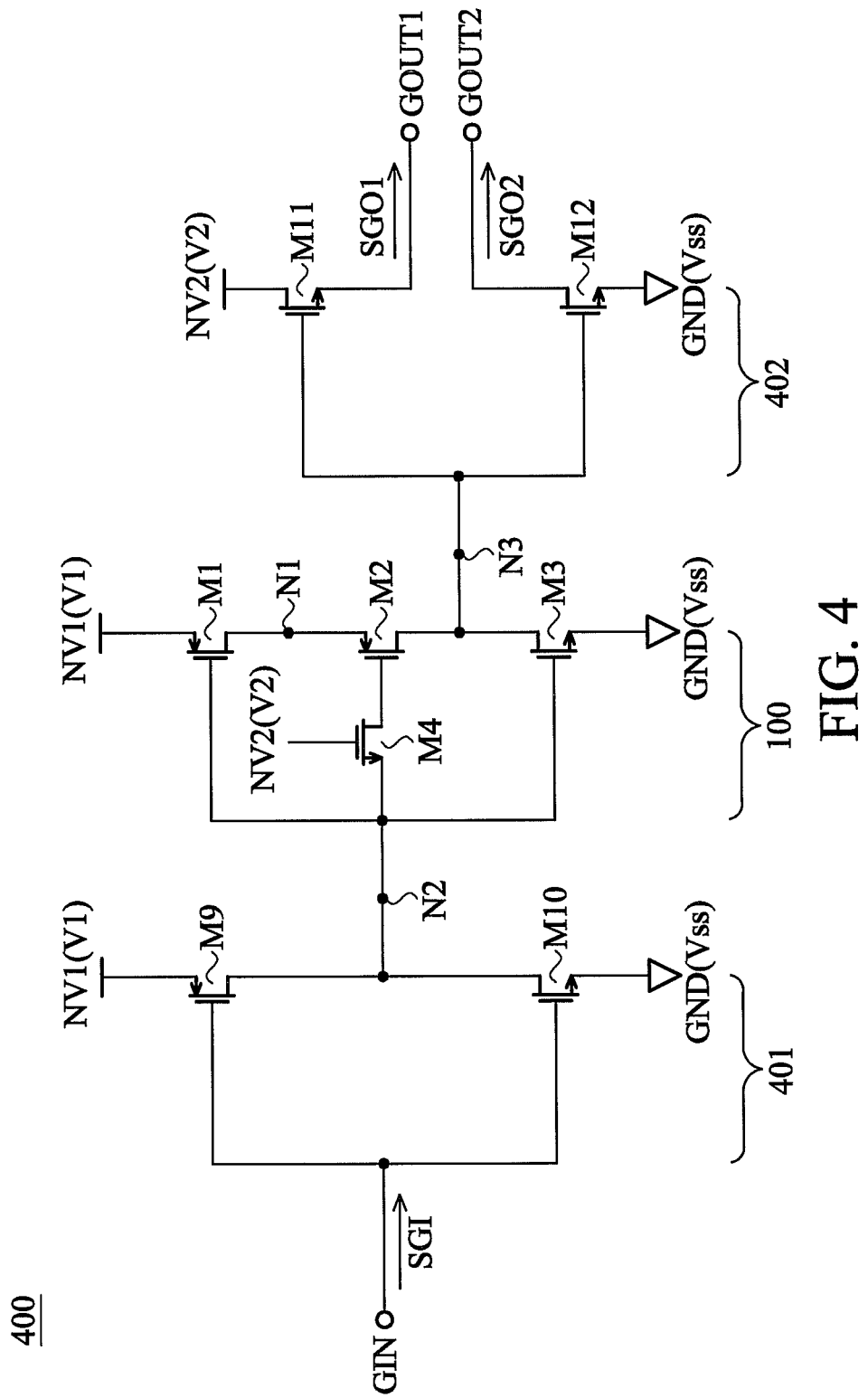
FIG. 4 is a diagram for illustrating a control circuit according to an embodiment of the invention.

FIG. 4 is a diagram for illustrating a control circuit 400 according to an embodiment of the invention, which illustrates one application of the protecting circuit 100. The control circuit 400 comprises a converter 401, a protecting circuit 100, and a power gate driving circuit 402. The control circuit 400 has an input node GIN and output nodes GOUT1, GOUT2, wherein the input node GIN is configured to receive an input signal SGI, and the output nodes GOUT1, GOUT2 are configured to output the output signals SGO1, SGO2, respectively.

Referring to FIG. 2, an external voltage Vdd (i.e., work voltage Vdd) of the control circuit 400 is converted into a pump voltage Vpp through a pump 202 (i.e., a step-up circuit), and the external voltage Vdd of the control circuit 400 is converted into an internal voltage Vint through a LDO (Low Dropout Regulator) 204 (i.e., a step-down circuit). In a preferred embodiment, the first voltage V1 is equivalent to the pump voltage Vpp, and the second voltage V2 is equivalent to the internal voltage Vint. The first voltage V1 is usually higher than the second voltage V2.

The inverter 401 comprises a PMOS transistor M9 and an NMOS transistor M10. The PMOS transistor M9 has a gate, a source and a drain, wherein the gate is electrically connected to the input node GIN, the source is electrically connected to the first voltage node NV1, and the drain is electrically connected to a node N2. The NMOS transistor M10 has a gate, a source and a drain, wherein the gate is electrically connected to the input node GIN, the source is electrically connected to the ground node GND, and the drain is electrically connected to the node N2.

The protecting circuit 100 has the input node IN, which is electrically connected to the node N2, and has the output node OUT, which is electrically connected to a node N3. Other elements of the protecting circuit 100 have been illustrated as above, and they will not be described again here.

The power gate driving circuit 402 comprises NMOS transistors M11, M12. The NMOS transistor M11 has a gate, a source and a drain, wherein the gate is electrically connected to the node N3, the source is electrically connected to the output node GOUT1, and the drain is electrically connected to the second voltage node NV2. The NMOS transistor M12 has a gate, a source and a drain, wherein the gate is electrically connected to the node N3, the source is electrically connected to the ground node GND, and the drain is electrically connected to the output node GOUT2.

The power gate driving circuit 402 is configured to generate the output signals SGO1, SGO2 according to the input signal SGI. For example, if the input signal SGI is equal to the first voltage V1, the output signal SGO1 will be approximately equal to the second voltage V2, and the output signal SGO2 will be approximately equal to the ground voltage Vss. If the input signal SGI is equal to the ground voltage Vss, the output nodes GOUT1 and GOUT2 will be floated (high impedance), such that no output signal is generated.

The invention provides a protecting circuit and a control circuit comprising the protecting circuit for reducing GIDL. That reduces consumption of electrical power in CMOS devices.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

It will be apparent to those skilled in the art that various modifications and variations can be made in the invention. It is intended that the standard and examples be considered as exemplary only, with a true scope of the disclosed embodiments being indicated by the following claims and their equivalents.

What is claimed is:

1. A protecting circuit for reducing leakage currents, comprising:
   a first PMOS transistor (P-channel Metal-Oxide-Semiconductor Field-Effect Transistor), coupled between a first voltage node and a node, and having a first gate coupled to an input node;
   a second PMOS transistor, coupled between the node and an output node, and having a second gate;
   a first NMOS transistor (N-channel Metal-Oxide-Semiconductor Field-Effect Transistor), coupled between the output node and a ground node, and having a third gate coupled to the input node; and
   a second NMOS transistor, coupled between the input node and the second gate, and having a fourth gate coupled to a second voltage node,
   wherein the ground node provides a ground voltage, the first voltage node provides a first voltage, the second voltage node provides a second voltage, and the first and second voltages are both higher than the ground voltage.

2. The protecting circuit as claimed in claim 1, wherein the input node is configured to receive an input signal, and the output node is configured to generate an output signal.

3. The protecting circuit as claimed in claim 1, wherein the first voltage is higher than the second voltage.

4. The protecting circuit as claimed in claim 1, wherein an external voltage is converted into the first voltage by a pump.

5. The protecting circuit as claimed in claim 1, wherein an external voltage is converted into the second voltage by an LDO (Low Dropout Regulator).

6. A protecting circuit for reducing leakage currents, comprising:
   a first PMOS transistor (P-channel Metal-Oxide-Semiconductor Field-Effect Transistor), coupled between a first voltage node and a node, and having a first gate coupled to an input node;
   a second PMOS transistor, coupled between the node and an output node, and having a second gate;
   a first NMOS transistor (N-channel Metal-Oxide-Semiconductor Field-Effect Transistor), coupled between the output node and a ground node, and having a third gate coupled to the input node;
   a first inverter, coupled to a second voltage node; and
   a second inverter, coupled to the second voltage node,
   wherein the input node is coupled to the second gate through the first and second inverters, the ground node provides a ground voltage, the first voltage node provides a first voltage, the second voltage node provides a second voltage, and the first and second voltages are both higher than the ground voltage.

7. The protecting circuit as claimed in claim 6, wherein the input node is configured to receive an input signal, and the output node is configured to generate an output signal.

8. The protecting circuit as claimed in claim 6, wherein the first voltage is higher than the second voltage.

9. The protecting circuit as claimed in claim 6, wherein an external voltage is converted into the first voltage by a pump.

10. The protecting circuit as claimed in claim 6, wherein an external voltage is converted into the second voltage by an LDO (Low Dropout Regulator).

11. The protecting circuit as claimed in claim 6, wherein the first inverter comprises:
    a third PMOS transistor, coupled between the second voltage node and a first inverter output end, and having a fourth gate coupled to a first inverter input end; and
    a second NMOS transistor, coupled between the first inverter output end and the ground node, and having a fifth gate coupled to the first inverter input end,
    wherein the first inverter input end is coupled to the input node, and the first inverter output end is coupled to the second inverter.

12. The protecting circuit as claimed in claim 6, wherein the second inverter comprises:
    a fourth PMOS transistor, coupled between the second voltage node and a second inverter output end, and having a sixth gate coupled to a second inverter input end; and
    a third NMOS transistor, coupled between the second inverter output end and the ground node, and having a seventh gate coupled to the second inverter input end,
    wherein the second inverter input end is coupled to the first inverter, and the second inverter output end is coupled to the second gate of the second PMOS transistor.

13. A control circuit for reducing leakage currents, comprising:
    a first PMOS transistor (P-channel Metal-Oxide-Semiconductor Field-Effect Transistor), coupled between a first voltage node and a first node, and having a first gate coupled to a second node;
    a second PMOS transistor, coupled between the first node and a third node, and having a second gate;
    a first NMOS transistor (N-channel Metal-Oxide-Semiconductor Field-Effect Transistor), coupled between the third node and a ground node, and having a third gate coupled to the second node;
    a second NMOS transistor, coupled between the second node and the second gate, and having a fourth gate coupled to a second voltage node;
    an inverter, coupled to the first voltage node, wherein an input node is couple to the second node through the inverter; and
    a power gate driving circuit, coupled to the second voltage node and to the third node, and generating a first output signal and a second output signal according to an input signal which is received through the input node,
    wherein the ground node provides a ground voltage, the first voltage node provides a first voltage, the second voltage node provides a second voltage, and the first and second voltages are both higher than the ground voltage.

14. The control circuit as claimed in claim 13, wherein the first voltage is higher than the second voltage.

15. The control circuit as claimed in claim 13, wherein an external voltage is converted into the first voltage by a pump.

16. The control circuit as claimed in claim 13, wherein an external voltage is converted into the second voltage by an LDO (Low Dropout Regulator).

17. The control circuit as claimed in claim 13, wherein the inverter comprises:
    a third PMOS transistor, coupled between the first voltage node and the second node, and having a fifth gate coupled to the input node; and
    a third NMOS transistor, coupled between the second node and the ground node, and having a sixth gate coupled to the input node.

18. The control circuit as claimed in claim 13, wherein the power gate driving circuit comprises:
- a fourth NMOS transistor, coupled between the second voltage node and a first output node, and having a seventh gate coupled to the third node; and
- a fifth NMOS transistor, coupled between a second output node and the ground node, and having a eighth gate coupled to the third node,
- wherein the first and second output nodes are configured to output the first and second output signals, respectively.

* * * * *